United States Patent [19]

Lovelace et al.

[11] Patent Number: 5,061,859
[45] Date of Patent: Oct. 29, 1991

[54] CIRCUITS FOR REALIZING AN OPTICAL ISOLATOR

[75] Inventors: Ralph E. Lovelace, Los Gatos; David J. Gampell, Sunnyvale; James S. Ignowski, Santa Clara, all of Calif.

[73] Assignee: Hewlett-Packard Company, Palo Alto, Calif.

[21] Appl. No.: 406,799

[22] Filed: Sep. 13, 1989

[51] Int. Cl.$^5$ .............................................. G02B 27/00
[52] U.S. Cl. ...................................... 250/551; 307/311
[58] Field of Search ........................... 250/551, 214 R; 307/311

[56] References Cited

U.S. PATENT DOCUMENTS

| | | | |
|---|---|---|---|
| 3,715,607 | 2/1973 | Fleming | 307/311 |
| 4,368,385 | 1/1983 | Kanbe et al. | 250/551 |
| 4,694,157 | 9/1987 | Mishina | 307/311 |
| 4,719,358 | 1/1988 | Matsumoto et al. | 250/551 |
| 4,864,126 | 9/1989 | Walters et al. | 250/551 |

Primary Examiner—David C. Nelms
Assistant Examiner—Que Tan Le

[57] ABSTRACT

An optical transmitter/receiver pair has an integrated CMOS circuit that provides a current flow to a prebiased solid state light emitting device (LED) in response to the presence or absence of a digital input signal. The current flow is augmented at the rising and falling edges of the input signal to enhance turn-on and turn-off speed of the LED. The LED is optically coupled to a photodiode that produces a current flow in response to illumination. The photodiode is shielded from spurious electronic noise by a transparent shield and the output of the photodiode is amplified to produce an output voltage, which is connected to a capacitively delayed voltage divider. The voltage divider generates a time delayed threshold voltage connectable along with the output voltage to the inputs of a comparator.

18 Claims, 1 Drawing Sheet

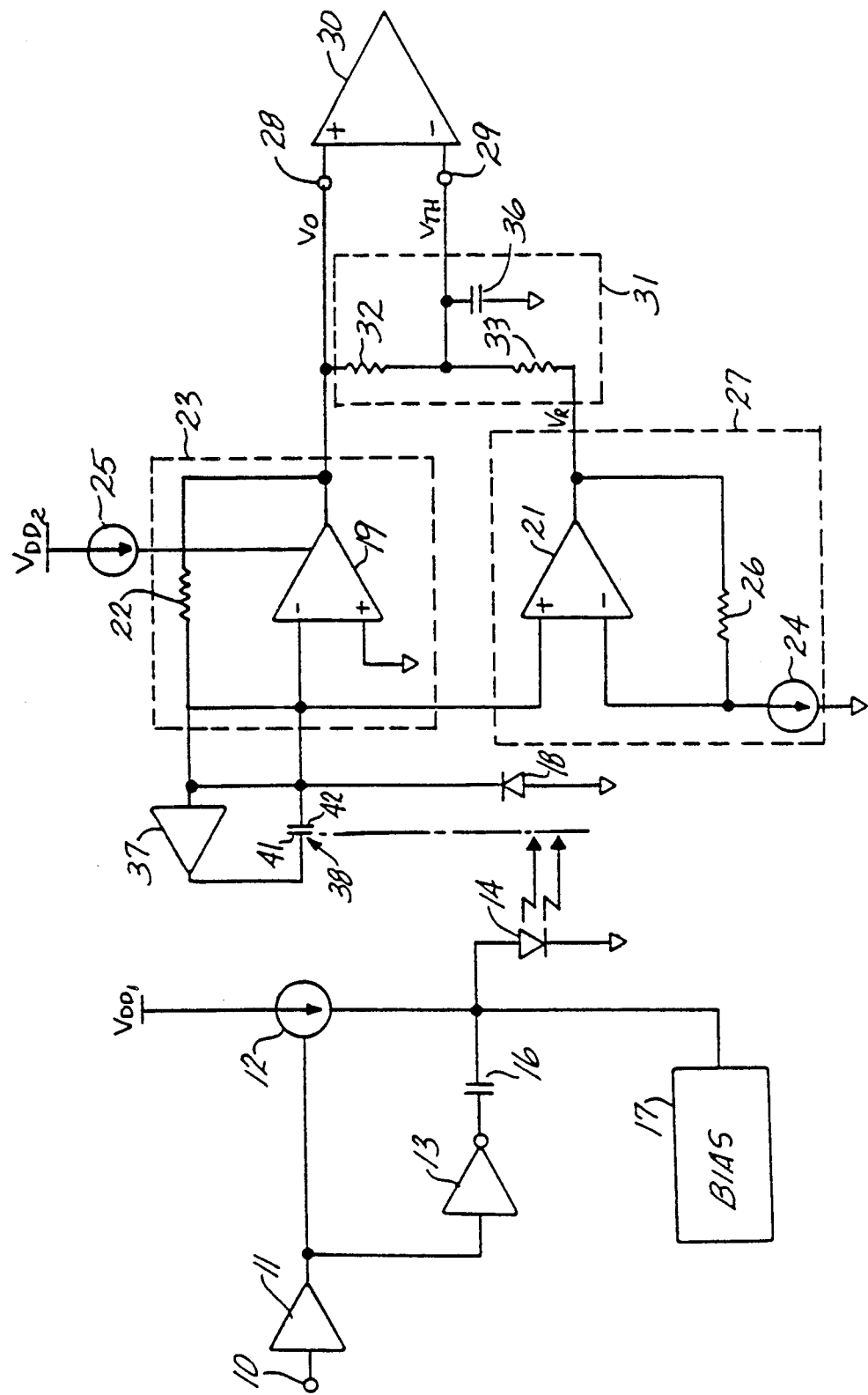

5,061,859

CIRCUITS FOR REALIZING AN OPTICAL ISOLATOR

BACKGROUND OF THE INVENTION

An optical isolator provides isolation between a control circuit and a switched circuit. A typical optical isolator has a light emitting diode (LED) electronically coupled to the control circuit. Often the LED is connected in series with the control circuit, and it thus uses current derived from the control signal to illuminate the LED rather than from the circuit's power supplies. The LED is optically coupled across an electronically isolating gap to a photovoltaic device (such as a photodiode). The photodiode is in turn connected to switching circuitry that is compatible with the power and current requirements of the switched circuit. In a typical optical isolator circuit, a comparator is used to provide the power and current requirements for the switched circuit. Light from the LED creates a voltage across the photodiode which causes the comparator inputs to switch polarity. Alternatively, when light from the LED ceases, the voltage across the photodiode collapses and the comparator inputs switch back to their initial state.

One of the critical limitations of optical isolators is the speed of the switching action. Switching speed may be impaired in a number of ways, one being by slow LED turn-on and turn-off. Since an LED is a current driven device, it requires a substantially square transition current waveform in order to have fast turn-on and turn-off times. A second factor that affects the speed of the optical isolator is the crossover time of the output comparator. A comparator has two reference inputs and an output, the output being dependent on the relative polarities of the reference inputs and the reference inputs being dependent on the photodiode voltage. The comparator output changes when the two reference inputs cross over and reverse polarity. The switching speed of the comparator is impaired where voltage potential between the reference inputs is large as it takes more time for the reference inputs to cross over.

It is, therefore, desirable to provide an optical isolator having improved turn-on and turn-off characteristics and enhanced switching reliability.

SUMMARY OF THE INVENTION

The present invention provides a transmitter/receiver pair for an optical isolator having a switched current source for applying an ON-current to a light emitting diode (LED) in response to the presence or absence of a digital input signal. The ON-current is augmented by current pulses generated at the rising and falling edges of the digital signal with a buffered capacitor connected in series between the digital input signal and the LED. A voltage is applied in parallel to the LED to bias the LED just below its turn-on voltage.

A photovoltaic device is optically coupled to the LED across an electronically isolating gap. Light from the LED causes current to flow through the photovoltaic device. The photovoltaic device is covered by a Faraday shield with a floating reference to eliminate common-mode signals that are capacitively coupled to the photovoltaic device. The photovoltaic device current is applied to a transimpedance amplifier and a unity gain amplifier to produce an output voltage and a reference voltage respectively. The output voltage and the reference voltage are connected to a delayed decaying voltage divider to produce a threshold voltage which is used together with the output voltage as circuit outputs connectable to a comparator.

BRIEF DESCRIPTION OF THE DRAWINGS

These and other features and advantages of the present invention will be better understood by reference to the following detailed description when considered in connection with the accompanying drawing which is a block representation of the preferred embodiment of the present invention.

DETAILED DESCRIPTION

The transmitter/receiver pair has an input terminal 10 which is connected to the input of a high impedance CMOS (complementary metal-oxide semiconductor) non-inverting buffer 11. The non-inverting buffer accepts a TTL-level input and converts it to CMOS levels. Since the non-inverting buffer has a high input impedance, it can be driven directly from CMOS logic or logic bus structures.

The output of the non-inverting buffer is connected to the gate of a CMOS switched current source 12 and the input of a CMOS inverting buffer 13. The output of the switched current source is connected to the anode of a solid state light emitting diode 14 (LED). The switched current source is powered by a first supply voltage, $V_{DD1}$. Current is supplied to the LED by the switched current source in response to the presence or absence of a digital input signal connected to the input terminal 10.

The anode of the LED is also connected to an integrated pulse capacitor 16 which is connected in series between the LED and the output of the inverting buffer 13. The digitally varying voltage signal at the output of the inverting buffer 13 produces current pulses at the output of the pulse capacitor. These current pulses are designed to be substantially time aligned with the rising and falling edges of the digital current waveform at the output of the switched current source 12. The inverting buffer 13 ensures that a positive going current pulse is generated by the pulse capacitor when the switched current source is enabled. Likewise, a negative going current pulse is generated when the switched current source is disabled. The current generated by the pulse capacitor augments current from the switched current source to form a current waveform with faster rise and fall times. This results in faster LED turn-on and turn-off times than would be possible with the switched current source alone.

In an exemplary embodiment, the switched current source is enabled when the digital input signal is in its low state. Thus, assuming the input signal is initially high, the switched current source is disabled, and no current flows through the LED. When the input switches low, the switched current source is enabled and current begins to flow through the LED causing the LED light output to rise exponentially from zero to its maximum value. The high to low voltage transition of the input signal results in a low to high voltage transition of the output of the inverting buffer 13. This causes an instantaneous current pulse from pulse capacitor 16 substantially coincident with falling edge of the input signal to discharge through the LED. Although the current pulse falls back to zero once the capacitor is discharged, it provides additional current to the LED during turn-on. The LED is held in the ON-state as long as the switched current source is enabled.

In the above described embodiment, the switched current source can be disabled by allowing the input signal to switch from low to high. As a result, the output of the switched current source will fall back to zero. The high to low transition at the output of the inverting buffer will cause a current pulse to flow from the LED through the pulse capacitor which enhances the turn-off time of the LED.

A pre-bias CMOS circuit 17 is also connected to the anode of the LED to further enhance its turn-on and turn-off times. The pre-bias circuit provides a bias voltage of approximately 0.8 to 1.0 volts which charges the LED capacitance to a level just below that required for it to emit light. Therefore, it requires less time to charge and discharge the LED capacitance to and from its ON-state.

The non-inverting buffer 11, switched current source 12, inverting buffer 13, pulse capacitor 16 and pre-bias circuit 17 together create a transmitter circuit which controls illumination from the LED 14 in response to an input signal at the input terminal 10. In an exemplary embodiment, all of the components in the transmitter circuit are integrated into a single CMOS chip with the exception of the LED which is a solid state device.

The LED is optically coupled to an integrated photodiode 18, the anode of the photodiode being grounded. The cathode of the photodiode is connected to the inverting input of a CMOS signal operational amplifier (op-amp) 19 and to the non-inverting input of a CMOS reference op-amp 21. The non-inverting input of the signal op-amp is grounded and the output of the signal op-amp is connected to its inverting input through an integrated feedback resistor 22. The signal op-amp and the feedback resistor together create a transimpedance amplifier 23 with negative feedback which provides output voltage, $V_O$, in response to current flowing through the photodiode. The transimpedance amplifier is connected to the output of a regulator current source 25 which is powered by a second supply voltage $V_{DD2}$. Applying power to the circuit causes a quiescent DC offset voltage to appear at the outputs of the signal op-amp 19 and the reference op-amp 21. Exemplary voltage values quoted within this specification are given relative to this quiescent DC offset. In an exemplary embodiment the output voltage, $V_O$, will be 0 volts when there is no current flowing through the photodiode, and $V_O$ will rise to approximately 400 mV when the photodiode is activated by the light from the LED.

The inverting input of the reference op-amp is connected to an integrated biasing current source 24. The output of the reference op-amp is coupled to its inverting input through an integrated bias resistor 26. The reference op-amp, together with the bias resistor 26 and the biasing current source 24 create a unity-gain amplifier 27 that provides a reference voltage $V_R$. The biasing current source 24 and the bias resistor 26 ensure that the reference voltage is offset from the output voltage when the photodiode is not activated. In an exemplary embodiment, the reference voltage is biased at 90 mV when the photodiode is not providing current to the circuit.

The transmitter/receiver pair has a leading output terminal 28 and a trailing output terminal 29 which are connectable to a voltage comparator 30. An exemplary comparator operates such that its output generates an ON-signal when the voltage at the leading output terminal 28 is more positive than the voltage at the trailing output terminal 29, and the comparator output generates an OFF-signal when the voltage at the trailing output terminal 29 is more positive than the voltage at the leading output terminal 28. Thus, the comparator output switches whenever the relative voltages at the output terminals reverse polarity. It should be understood that the ON-signal and the OFF-signal that the comparator generates may be of any relative magnitude and may be related to the polarity of the input signal at the input terminal 10 either positively or inversely.

The output voltage, $V_O$, is applied to output terminal 28. The other output terminal is connected to the output of an integrated moving threshold detector 31. A first divider resistor 32 is connected at one terminal to the output of the transimpedance amplifier 23 and at the opposite terminal to one terminal of a second divider resistor 33. The opposite terminal of the second divider resistor is connected to the output of the unity-gain amplifier 27, thus creating a voltage divider between $V_O$ and $V_R$. The common node 34 to the first and second divider resistors provides a threshold voltage $V_{TH}$ which is applied to the output terminal 29. The threshold voltage is also applied to one plate of a threshold capacitor 36, the other plate being connected to ground.

In an exemplary embodiment the first divider resistor 32 is approximately half as large as the second divider resistor 33. This sets the threshold voltage, $V_{TH}$, at approximately two-thirds the voltage between $V_R$ and $V_O$. Using the exemplary values for $V_O$ and $V_R$ previously described, it can be seen that when the photodiode is not illuminated, $V_R$ is at 90 mV, $V_O$ is at 0 V and $V_{TH}$ is at 30 mV. When the photodiode is activated, $V_O$ rises to 400 mV and $V_R$ remains essentially at 90 mV (it actually falls approximately 5 mV because of the voltage drop across the photodiode). This results in $V_{TH}$ being set at approximately 297 mV, two-thirds of the voltage difference between $V_O$ and $V_R$. It should be noted that voltage at the output terminals reversed polarity. When $V_O$ falls back down to 0 V, their polarity will once again reverse. However, ignoring the presence of the threshold capacitor, $V_O$ would have to fall nearly back to 0 V before this would occur due to the linear nature of voltage divider.

The threshold capacitor 36, along with the driver resistors, provides for a delayed decaying threshold voltage which delays the movement of $V_{TH}$ as compared to $V_O$, and thus compensates for the relatively large voltage swing of $V_O$. With compensation, the output voltage crosses over the threshold voltage and causes the voltages at the output terminals to reverse polarity in less time than would be required if the threshold and output voltages decayed at the same rate. The size of the threshold capacitor 36 must be tuned to optimize the performance of the circuit since the threshold voltage, $V_{TH}$, must perform two distinct functions. First, it must follow the movement of $V_O$ to provide an elevated threshold, and second, it must remain at some elevated level once $V_O$ drops to facilitate the reversal of the polarities at the output terminals 28 and 29. If the threshold capacitor is too large, $V_{TH}$, will not effectively follow $V_O$. If the threshold capacitor is too small, it will discharge through the second divider resistor and the bias resistor quickly without providing an elevated reference which the output voltage, $V_O$, can cross.

In an exemplary embodiment, the photodiode 18, regulator current source 25, and the circuit components in the transimpedance amplifier 23, unity-gain amplifier 27 and moving threshold detector 31 make up a portion of a receiver circuit which is integrated on a single CMOS chip. In an exemplary embodiment, separate ground references are supplied for the transmitter circuit and the receiver circuit for increasing electrical isolation between the transmitter and receiver circuitry.

The cathode of the photodiode 18 is connected to the input of a low output impedance shield buffer 37. The shield buffer has unity gain and is integrated on the receiver CMOS chip. The output of the shield buffer is connected to a transparent electrically conductive plate 41, indicated by a dot-dash line in the drawing, which is mechanically situated between the transmitter CMOS chip and the receiver CMOS chip. In an exemplary embodiment, a layer of polycrystalline silicon suffices to provide the transparent conductive plate. The conductive plate 41 is electronically isolated from all components on the transmitter and receiver CMOS chips with the exception of the shield buffer.

The transparent nature of the conductive plate allows optical signals to be transmitted while shielding the receiver circuit from electrical signals radiated from the transmitter circuit. The shield buffer 37 provides a current path for electrical signals shielded by the conductive plate 41 without limiting the bandwidth of the transimpedance amplifier 23. One way in which the bandwidth of an op-amp is limited is by stray capacitance between the op-amp inputs. If the conductive plate 41 were connected to ground, then the inherent capacitance 38 between the conductive plate and the cathode 42 of the photodiode 18 could create capacitance between the inputs to the signal operational amplifier 19. In the present invention, the inherent capacitance 38 does not limit the bandwidth of the signal op-amp since the conductive plate 41 is pulled up to a floating reference at the output of the shield buffer 37. The inherent capacitance 38 is prevented from accumulating charge since the shield buffer has a low impedance output.

The shield buffer 37 has unity-gain to ensure that the cathode of the photodiode and the conductive plate remain at substantially the same voltage potential. This, in turn, ensures that current generated by the photodiode in response to light from the LED is amplified by the transimpedance amplifier and is not diverted to charge the inherent capacitance 38.

It should be apparent to one skilled in the art that alternative embodiments exist that are within the nature and principle of this invention. For example, it is apparent that discrete solid state devices could be used to implement the present invention rather than integrating the circuit in CMOS chips. It is also apparent that a common ground can be used as a reference for all of the circuit components. Accordingly, the foregoing description should not be read as pertaining only to the precise structure described, but rather should be read consistent with, and as support for, the following claims.

What is claimed is:

1. A transmitter/receiver pair for an optical isolator comprising:
    illumination means for generating a light output in response to an input signal;
    photoresponsive means optically coupled to the illumination means for generating a signal voltage in response to light;
    means for generating a threshold voltage offset from the signal voltage;
    means for generating an ON signal when the signal voltage is greater than the threshold voltage and an OFF signal when the threshold voltage is greater than the signal voltage;
    means for generating an offset reference voltage which determines the threshold voltage when the signal voltage is ON; and
    means for delaying decay of the threshold voltage when the signal voltage goes OFF.

2. A transmitter/receiver pair as recited in claim 1 wherein the means for generating a threshold voltage comprises:
    a voltage divider between the signal voltage and the offset reference voltage, the threshold voltage being at the center tap of the divider; and
    a capacitor connected to the threshold voltage for delaying the voltage divider's response.

3. A transmitter/receiver pair as recited in claim 1 wherein the photoresponsive means comprises a photodiode coupled to an operational amplifier with negative feedback.

4. A transmitter/receiver pair as recited in claim 1 wherein the means for generating an offset reference voltage comprises a unity gain operational amplifier.

5. A transmitter/receiver pair for an optical isolator comprising:
    illumination means for generating a light output in response to an input signal;
    photoresponsive means optically coupled to the illumination means for generating a signal voltage in response to light;
    shielding means for absorbing common-mode signals which are capacitively coupled to the photoresponsive means while preserving the switching bandwidth of the photoresponsive means;
    means for generating a reference voltage offset from the signal voltage; and
    compensation means for providing a delayed decaying threshold voltage in response to the offset reference voltage and the signal voltage.

6. A transmitter/receiver pair as recited in claim 5 wherein the shielding means comprises a transparent conductive plate coupled to the output of a unity gain buffer having a low impedance output, the input of the unity gain buffer being connected to the photoresponsive means.

7. A transmitter/receiver pair as recited in claim 6 wherein the illumination means is comprised of a solid state light emitting diode.

8. A transmitter/receiver pair as recited in claim 7 wherein the photoresponsive means, the shielding means, the means for generating a reference voltage and the compensation means are integrated on a CMOS chip.

9. A transmitter/receiver pair for an optical isolator comprising:
    illumination means for generating a light output in response to current flow;
    a switched current source for applying current to the illumination means in response to the presence or absence of an input signal;
    means for augmenting the current from the switched current source only when the input signal is in transition between states; and
    photoresponsive means optically coupled to the illumination means for generating an output voltage.

10. A transmitter/receiver pair as recited in claim 9 further comprising means for applying a bias voltage to the illumination means.

11. A transmitter/receiver pair as recited in claim 9 wherein the means for augmenting current comprises a capacitor connected in series between the illumination means and the input signal.

12. A transmitter/receiver pair for an optical isolator comprising:

solid state illumination means for generating a light output in response to current flow;

a switched current source for applying current to the illumination means in response to the presence or absence of an input signal;

means for augmenting the current from the switched current source only when the input signal is in transition between states; and photoresponsive means optically coupled to the illumination means for generating a signal voltage in response to light;

means for generating a threshold voltage offset from the signal voltage; and means for generating an ON signal when the signal voltage is greater than the threshold voltage and an OFF signal when the threshold voltage is greater than the signal voltage;

means for generating an offset reference voltage which determines the threshold voltage when the signal voltage is ON; and means for delaying decay of the threshold voltage when the signal voltage goes OFF.

13. A transmitter/receiver pair as recited in claim 12 wherein the switched current source and means for augmenting current are integrated on a first CMOS chip.

14. A transmitter/receiver pair as recited in claim 13 wherein the photoresponsive means, means for generating a threshold voltage and means for generating an ON signal and OFF signal are integrated on a second CMOS chip.

15. A transmitter/receiver pair as recited in claim 12 wherein the photoresponsive means, means for generating a threshold voltage and means for generating an ON signal and OFF signal are integrated on a second CMOS chip.

16. A transmitter/receiver pair for an optical isolator comprising:

illumination means for generating a light output in response to a binary input signal;

comparator means, having a signal voltage input and a threshold voltage input, the comparator means generating an ON signal when the signal voltage input is greater than the threshold voltage input and an OFF signal when the threshold voltage input is greater than the signal voltage input;

photoresponsive means optically coupled to the illumination means for generating a signal voltage in response to light, the signal voltage being connected to the signal voltage input of the comparator means; and means for generating a threshold voltage which tracks the movement of the signal voltage, the threshold voltage being connected to the threshold voltage input of the comparator means.

17. A transmitter/receiver pair as recited in claim 16 wherein the threshold voltage has a voltage potential sufficient to cause the comparator means to change its output each time the signal voltage switches between its binary values.

18. A transmitter/receiver pair as recited in claim 17 wherein the means for generating a threshold voltage comprises:

a voltage divider connected to the signal voltage;

means for generating an offset reference voltage connected to the voltage divider which determines the threshold voltage when the signal voltage is OFF; and means for delaying the transition of the threshold voltage in response to the movement of the signal voltage.

* * * * *